United States Patent [19]

Wiste

[11] Patent Number: 5,314,732
[45] Date of Patent: * May 24, 1994

[54] FLEXIBLE, TRANSPARENT FILM FOR ELECTROSTATIC SHIELDING

[75] Inventor: Orville M. Wiste, Round Rock, Tex.

[73] Assignee: Minnesota Mining and Manufacturing Company, St. Paul, Minn.

[*] Notice: The portion of the term of this patent subsequent to Nov. 24, 2009 has been disclaimed.

[21] Appl. No.: 722,956

[22] Filed: Jun. 28, 1991

[51] Int. Cl.$^5$ .......................... B32B 1/08; B32B 5/16; B65D 30/00

[52] U.S. Cl. .................................. 428/35.3; 383/106; 383/109; 428/35.8; 428/36.4; 428/220; 428/292; 428/328; 428/918; 428/922

[58] Field of Search .................. 428/35.3, 35.8, 36.2, 428/36.4, 288, 290, 292, 328, 330, 461, 918, 922; 383/106, 109; 206/328

[56] References Cited

U.S. PATENT DOCUMENTS

| | | | |
|---|---|---|---|
| 3,572,499 | 3/1971 | Mondano | 206/1 |
| 3,801,418 | 4/1974 | Cornelis et al. | 161/43 |
| 3,888,711 | 6/1975 | Breitner | 156/93 |
| 4,154,344 | 5/1979 | Yenni, Jr. et al. | 206/524 |
| 4,156,751 | 5/1979 | Yenni, Jr. et al. | 428/212 |
| 4,208,696 | 6/1980 | Lindsay et al. | 361/212 |
| 4,407,872 | 10/1983 | Horii | 428/35 |
| 4,424,900 | 1/1984 | Petcavich | 206/328 |
| 4,471,872 | 9/1984 | Dedow | 206/328 |
| 4,528,222 | 7/1985 | Rzepecki et al. | 428/35 |
| 4,532,099 | 7/1985 | Kaji | 264/510 |
| 4,590,120 | 5/1986 | Klein | 428/247 |
| 4,623,594 | 11/1986 | Keough | 428/500 |
| 4,645,566 | 2/1987 | Kato et al. | 162/138 |
| 4,658,958 | 4/1987 | McNulty et al. | 206/328 |
| 4,699,830 | 10/1987 | White | 428/35 |
| 4,734,319 | 3/1988 | Doi et al. | 428/216 |
| 4,756,414 | 7/1988 | Mott | 206/328 |
| 4,804,582 | 2/1989 | Noding et al. | 428/332 |
| 4,875,581 | 10/1989 | Ray et al. | 206/328 |
| 4,906,494 | 3/1990 | Babinec et al. | 428/35.2 |
| 4,939,027 | 7/1990 | Daimon et al. | 428/284 |
| 4,957,943 | 9/1990 | McAllister et al. | 521/64 |
| 4,983,452 | 1/1991 | Daimon et al. | 428/287 |
| 4,992,329 | 2/1991 | Ishii et al. | 428/328 |
| 5,028,490 | 7/1991 | Koskenmaki | 428/594 |
| 5,165,985 | 11/1992 | Wiste et al. | 428/209 |

FOREIGN PATENT DOCUMENTS 64-38398 8/1989 Japan .

OTHER PUBLICATIONS

Standard No. 541, "Packaging Material Standards for ESD Sensitive Items".

Primary Examiner—George F. Lesmes
Assistant Examiner—Christopher Brown
Attorney, Agent, or Firm—Gary L. Griswold; Walter N. Kirn; Jack V. Musgrove

[57] ABSTRACT

A film providing electrostatic shielding comprises a first layer of a carrier material and a second layer of a thermoplastic, polymeric material, both layers being electrically insulative, flexible and transparent, and there further being a plurality of thin, conductive slivers suspended in the second layer. The slivers form an essentially two-dimensional, conductive network which is suspended in the second layer, and may be present in an amount as little as 2 g/m$^2$. The slivers have a melting temperature greater than the melting temperature of the polymeric material, and the polymeric material has a melting temperature lower than that of the carrier material. The film passes at least 70% of visible light.

19 Claims, 2 Drawing Sheets

FLEXIBLE, TRANSPARENT FILM FOR ELECTROSTATIC SHIELDING

BACKGROUND OF THE INVENTION

1. Field of the Invention

The present invention generally relates to packaging materials for products which are sensitive to static electric fields and discharge, and more particularly to a flexible, transparent film which shields against electrostatic fields, and further resists triboelectric generation of static charges and provides for the rapid dissipation of such charges.

2. Description of the Prior Art

Electrostatic discharge, as well as the mere presence of a static electric field, can be extremely detrimental to sensitive electronic parts. This is particularly true of modern semiconductors and integrated circuits which may be degraded or destroyed by the buildup of static electricity in the workplace. Especially sensitive components can be severely affected by an electrical potential as small as 50 volts, yet the simple act of walking has been shown to triboelectrically generate a potential of 30,000 volts or more.

One of the most common methods of protecting electronic components is to store, ship and handle them using pouches, bags, tote boxes or other packaging constructed of materials which provide shielding against electrostatic fields and other electromagnetic influences. These materials may additionally provide for the rapid dissipation of electrostatic charges which are applied to the package, and/or include a coating which prevents or minimizes triboelectric charging along the surface of the package. The present invention is directed to a film which may be fashioned into packaging providing such protection.

The most basic function provided by these types of films is protection from static electric fields. This is typically achieved by forming a conductive layer on the film or dispersing conductive materials therein, which effectively creates a Faraday cage. An example of a rather complicated process for creating a shielding film is disclosed in U.S. Pat. No. 4,645,566 issued to Kato et al. A thermoplastic, synthetic pulp is mixed with thermoplastic, composite fibers and conductive fibers, resulting in a paper-type stock. This stock may be formed into a web, and when it is heated and dried at appropriate temperatures, the pulp melts, leaving a film which has a network of conductive fibers dispersed therein. Other processes using a pulp of polymeric and conductive components are discussed in Japanese Patent Application Kokai Nos. 60-210667, 60-257234 and 62-42499.

The use of a web carrier in creating a conductive intermediate layer is common. In U.S. Pat. Nos. 4,939,027 and 4,983,452, both issued to Daimon et al., a moldable static-shielding sheet is formed by first obtaining a web of nonwoven fabric comprising conductive fibers and thermoplastic fibers. The web may alternatively be formed by irregularly twining a conductive fiber with a hot-melt adhesive fiber. The web is placed between two thermoplastic films and heated. This bonds the films to the web, and further causes the thermoplastic fibers in the web to melt and combine with the films, leaving an imbedded layer of conductive fibers. Other techniques utilizing a web or fabric are shown in Japanese Patent Application Kokai Nos. 60-34099, 60,143699, 62-47200, 62-122300, 62-275727, and 62-276297.

In addition to providing electrostatic shielding, these films may be treated to provide for the rapid dissipation of static charges, and to further minimize the triboelectric generation of such charges. In accordance with the American National Standards Institute EIA standard 541 ("Packaging Material Standards for ESD Sensitive Items," published June 1988) the first of these qualities is referred to as static-dissipative, and the latter is referred to as antistatic. For example, U.S. Pat. No. 4,623,594 issued to A. Keough teaches the use of an electron-beam curable resin composition which may be applied to a substrate, and which causes the antistatic properties to migrate through the substrate upon curing.

One product which combines the qualities of electrostatic shielding, static-dissipation and triboelectric charge resistance is described in U.S. Pat. Nos. 4,154,344 and 4,156,751, both issued to Yenni et al. Those patents describe a sheeting material which is formed by first applying a conductive material, such as nickel, to one surface of a biaxially oriented polymer substrate, namely, polyester. The exposed nickel surface is then coated by a solvent process with a protective layer. A film of heat-sealable material (polyethylene) is extruded onto the opposite surface of the polyester film. The extruded polyethylene may include antistatic material (such as quaternary ammonium compounds), or be further coated with such antistatic agents. Other conductive materials, such as carbon-loaded plastics, may be substituted for the metallic coating.

A similar product and process is described in U.S. Pat. No. 4,756,414 issued to C. Mott, except that the conductive layer is provided between the heat-sealable plastic and the second plastic layer. The conductive layer is applied by either vacuum deposition or sputtering techniques. The two plastic layers may be joined using a thermosetting adhesive. See also Japanese Patent Kokoku No. 38398/89. In U.S. Pat. No. 4,875,581 issued to Ray et al., a dielectric material is interposed between the two plastic layers and, in addition to a conductive layer, the outer elastomeric layer of the film includes additives which make it static-dissipative. Even more complicated processes and resulting structures are known, such as the film discussed in U.S. Pat. No. 4,906,494 issued to Babinec et al., which utilizes a two-ply layer having a polyolefin and a copolymer of ethylene-acrylic acid and ethylene-vinyl acetate. In Babinec, the layers are joined using an adhesive or hot roll lamination.

Another laminated film is disclosed in U.S. Pat. No. 3,888,711 issued to W. Breitner. Although that film is primarily intended for use as a heated window or alarm glass, Breitner notes that it may also be used for shielding against electromagnetic interference. The lamination process used requires a knit of thermoplastic and conductive filaments which is applied to a sheet of thermoplastic material. The thermoplastic filaments are preferably constructed of the same materials as the thermoplastic sheet; the thermoplastic filaments should at least be fusible with the sheet. When the sheet is fed through hot rolls, the thermoplastic filaments fuse with the sheet, leaving a network of conductive filaments forming a plurality of interconnected conductive paths. A cover sheet may be laid on top of the network before hot rolling. Another lamination technique (using conductive strands rather than a web) is depicted in Japanese Patent Application Kokai No. 60-81900.

Each of the foregoing films has its disadvantages. First and foremost of these is the poor transmission of visible light ("transmissivity") through these films and packaging formed therefrom, whether they rely on metal coatings, carbon-loading or filament networks. Previously, increasing transmissivity meant sacrificing static-shielding ability. The best transmissivity claimed by any of the foregoing films is 60%, although this has proven very difficult to achieve at production levels. Furthermore, while this level of transmissivity allows a visual inspection of the general condition of items contained in the packaging, it does not provide adequate legibility, i.e., the ability to read printed matter on the item in the packaging, particularly if the printing is not flush against the interior surface of the film.

With respect to films formed using webs, fabrics or pulp, those processes are generally more complicated and, hence, the resulting films are more expensive. The films typically have even less transmissivity than metal coatings, but such coating processes also add significant expense. Pulp-type films are conductive through their thickness, and so require additional process steps to insulate their surfaces. As noted by Kato et al., films resulting from these processes further have inferior physical and chemical bonding resulting in low tensile, tear and surface strength.

A thin, conductive filamentary network would overcome many of these problems but it has been difficult in the past to apply such a network without the use of webs or pulp. Breitner notes that applying metal strips is labor intensive, but his process still requires a special prefabricated knit (or special machinery to directly apply filaments to the film). Breitner further notes the difficulties in using very thin conductive filaments, which would be preferable since this would enhance transmissivity through the network. Another problem with static-shielding films using filaments is that the network must be relatively dense, which inhibits transmissivity. For example, Daimon et al. ('027) teaches that the network must have minimum density of 15 g/m$^2$. Finally, sandwiching a conductive network between two polymeric layers, often results in wrinkles and/or voids at the interface where the filaments lay. This affects transmissivity and legibility, and may also increase the likelihood of peeling.

Several of the above limitations have been overcome by the film described in U.S. patent application Ser. No. 07/270,532, now U.S. Pat. No. 5,028,490 (D. Koskenmaki), assigned to Minnesota Mining and Manufacturing Co. (3M), assignee of the present invention. In that patent, which probably represents the closest prior art, molten strands of conductive material are squirted directly onto a polymeric substrate, which may then be further laminated. Nevertheless, the equipment necessary to produce molten filaments is relatively expensive, and presents clear hazards. Also, since the exemplary laminated films of Koskenmaki create an interface at the filamentary network, they are more likely to have wrinkles and/or voids, and more prone to peeling at the interface. Therefore, it would be desirable and advantageous to provide a static-shielding film having a very sparse network of thin conductive filaments to achieve improved transmissivity and legibility, the filaments further being suspended in a polymeric layer in such a manner that there is no discernable interface surrounding the filaments even though they form an essentially two-dimensional conductive network. The filaments should further not be applied in a molten state.

SUMMARY OF THE INVENTION

The foregoing objective is achieved in a film comprising a first layer of a carrier material which is electrically insulative, flexible, transparent, and dimensionally stable, and a second layer of a polymeric material bonded to the first layer, the polymeric material being electrically insulative, flexible, transparent, and thermoplastic, there being a plurality of conductive slivers embedded in the second layer forming an essentially two-dimensional, conductive network. The overall thickness of the film is relatively thin, e.g., about 100 $\mu$m, and the sliver may be present in an amount as little as 2g/m$^2$, resulting in a static-shielding film which passes at least 70% of visible light, and upwards of 85% of visible light. The slivers advantageously have a melting temperature above the melting temperature of the polymeric material, and the polymeric material further has a melting temperature which is lower than the melting temperature of the carrier material.

BRIEF DESCRIPTION OF THE DRAWINGS

The novel features and scope of the invention are set forth in the appended claims. The invention itself, however, will best be understood by reference to the accompanying drawings, wherein:

DESCRIPTION OF THE PREFERRED EMBODIMENT

Figure 1A:
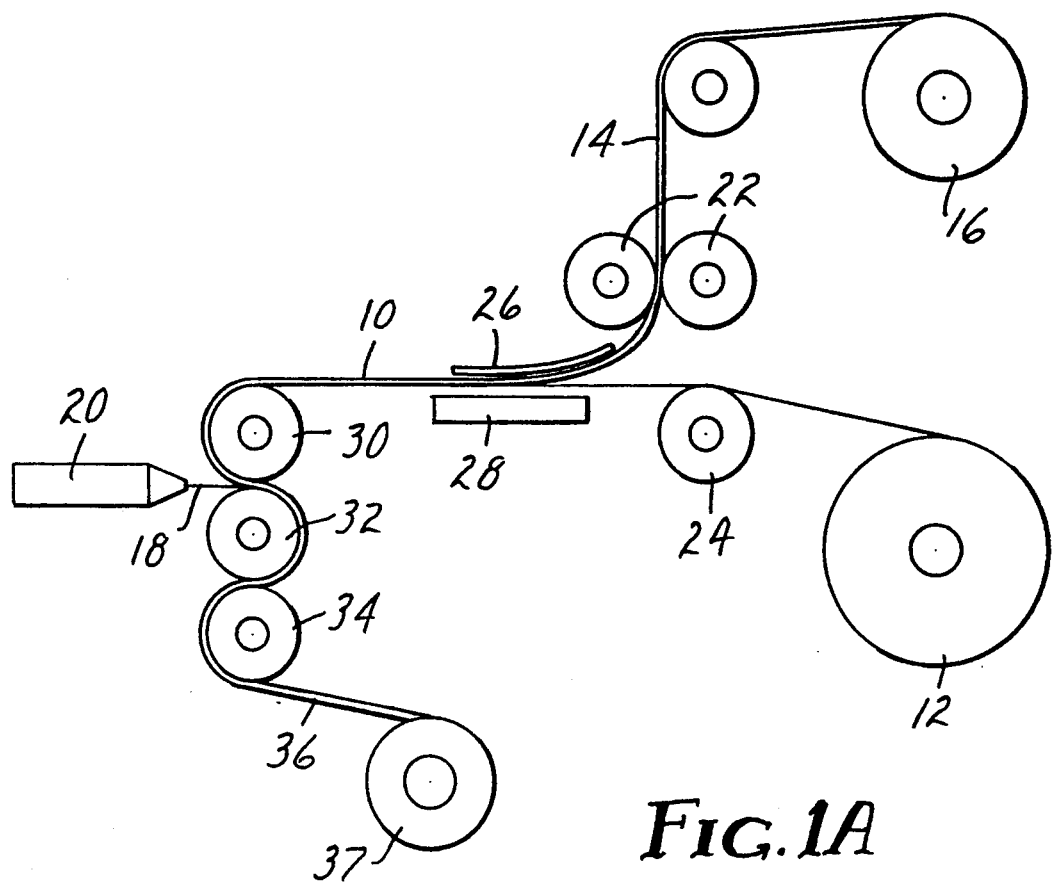
FIGS. 1A and 1B are side elevational views of process equipment which may be used to manufacture the static-shielding film of the present invention.
Figure 1B:
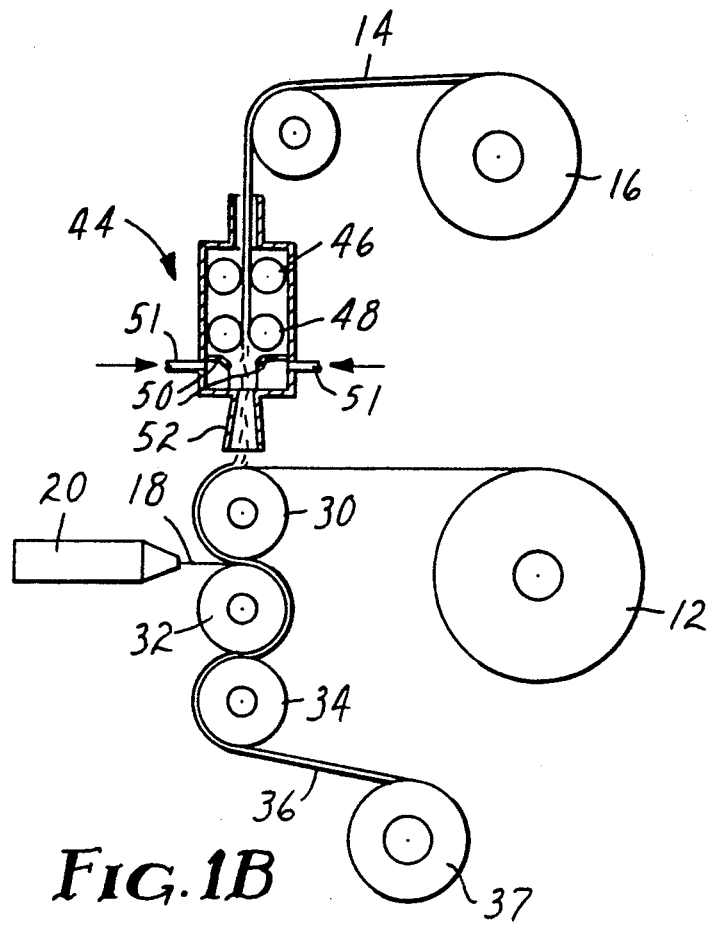

With reference now to the figures, and in particular with reference to FIGS. 1A and 1B, method of manufacturing a static-shielding film of the present invention is depicted. The three basic material components of the film are a sheet material 10 wound on a supply roll 12, a plurality of conductive strands gathered together in a tow 14, which may be provided on another supply roll 16, and a cover sheet 18 which is extruded from a die 20.

The sheet material 10 comprises a first layer formed of any electrically insulative and flexible carrier material, preferably polymeric, and a second layer formed of a second polymeric material which is electrically insulative, flexible, and thermoplastic. The melting temperature of the second polymeric material should be lower than that of the first polymeric (carrier) material, and both layers should be essentially transparent. In this regard, the term "transparent" means passing at least 70% of visible light. Appropriate polymers for the first polymeric material include, e.g., polyester, polypropylene or nylon. The first polymeric material has preferably been made both biaxially oriented and dimensionally stable, such as by stretching. The second polymeric material may be selected from the exemplary group consisting of low-density polyethylene, linear low-density polyethylene, high density polyethylene, ethylene methyl acrylate, ethylene vinyl acetate, or ethylene ethylacrylate. Sheet material 10 is advantageously very thin, in the range of 30–50 μm. In the preferred embodiment, sheet material 10 is a polymeric film known as SCOTCHPAR obtained from 3M, and comprises a first layer of polyethylene terephthalate (PET) and a second layer of polyethylene, the PET layer being about 23 μm thick, and the polyethylene layer being about 20 μm thick, yielding a total thickness of about 43 μm. The width of sheet material 10 may vary considerably, depending on the intended use of the film, e.g., a small pouch or a large bag. For example, the width may be in the range of 5 cm to several meters.

The tow 14 may comprise a plurality of very long conductive strands, or shorter slivers which are intertwined to form a rope-like tow. The strands or slivers should be very thin, i.e., a diameter no greater than about 12 μm. The strands or slivers may be formed of various metals and alloys, including stainless steel, silver or copper, or may be composite slivers formed of an inorganic filament having a conductive coating thereon. Several identical tows are typically used which may be obtained from Bekaert Steel Wire Corp. of Marietta, Ga. or Memcor Engineered Materials of Deland, Fla. Each of the tows comprise a plurality of slivers having an average length, depending upon the particular tow, of about 50 mm, 100 mm or 200 mm, the slivers being staggered and intertwined to form a cohesive rope of tow having a diameter in the range of 8–15 mm. These tows have adequate tensile strength to maintain their form if not handled too roughly, i.e., they may be conveyed reasonable distances without tearing or undue stretching. For fabrication of a film having a width of about 30 cm, four such tows are used.

The material for cover sheet 18 is a thermoplastic polymer which may be extruded in sheet form, and may be any of the materials listed above for the second layer of sheet 10. The material for extruded sheet 18 is preferably the same as the second polymeric material used in sheet 10, and should at least be miscible with the second polymeric material, as explained further below. The preferred material for cover sheet 10 is low density polyethylene.

With further reference to FIGS. 1A and 1B, it can be seen that sliver tow 14 is fed through nip rolls 22 lying above sheet material 10. The nip rolls preferably have a diameter of about 2.5 cm and are placed about 2.5 cm above sheet 10. The nip line is perpendicular to the direction of travel of sheet 10. Sliver tow 14 is fed through nip rolls 22 at a very slow rate with respect to the rate of movement of sheet 10. For example, in order to apply 3 grams of slivers per square meter, using a sliver tow weighing about 0.67 grams per foot, onto a sheet 10 that is one meter wide, the nip rate should be about 1/70th of the rate of travel of sheet 10.

Although the slivers may be applied in a regular pattern (including a grid pattern using a second nip roll to apply a second layer of perpendicular slivers), it is preferable to apply them in a random distribution. In the process shown in FIGS. 1A and 1B, it is necessary to use a sliver tow in which the individual slivers are at least 5 cm long and up to 20 cm in length. It is also preferable to heat sheet 10 sufficiently to cause the second layer thereof to become tacky (e.g., by using a hot roll 24 which melts the second layer), and thereby improve the adhesion of the slivers to its surface, but this is not necessary. Other means can be used to make the surface of the second layer tacky, such as applying an adhesive, but this may lead to peeling problems. Alternatively, the slivers may become attached to sheet 10 by mechanical means such as a pinch roll or a deflector 26 which forces the slivers into contact with sheet 10. As a further alternative, means may be provided to electromagnetically attract the slivers to sheet 10, such as magnetic or electrostatically charged plate 28 underlying sheet 10. This technique, of course, requires that the slivers be constructed of a magnetic or paramagnetic material.

Figure 2:
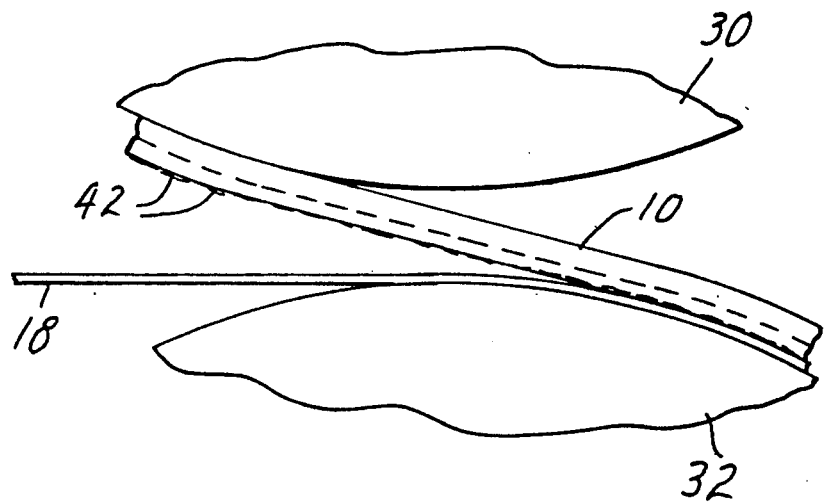
FIG. 2 is an enlarged side elevational view showing the lamination of the sheet material having slivers thereon with the extruded cover sheet.

When the slivers are applied, they form an essentially two-dimensional network, although the slivers do overlap slightly to impart conductivity throughout the network. After the slivers have been deposited on sheet 10, the sheet is fed through a group of three cylinders 30, 32 and 34. If sheet 10 has not been previously heated (as by hot roll 24), then cylinder 30 should be sufficiently hot to cause the second layer of sheet 10 to melt; it should not, however, be so hot as to cause the first layer of sheet 10 to melt. For the previous exemplary materials of PET and polyethylene, the temperature of hot roll 24 (or cylinder 30) should be in the approximate range of 120–150° C. Extruded cover sheet 18 then bonds easily to the second layer of sheet 10 as they are pressed between cylinders 30 and 32 (see FIG. 2). Cylinders 32 and 34 are preferably chilled to stabilize the resulting film 36. Film 36 may be drawn onto a take-up roll 37.

Figure 3:
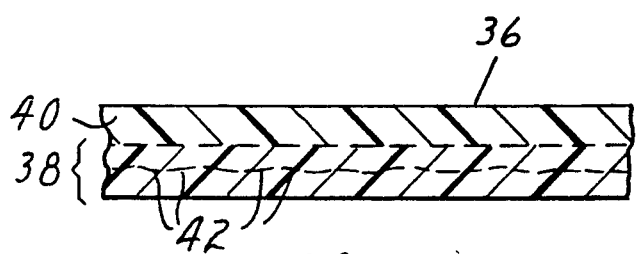
FIG. 3 is a cross-sectional view of the static-shielding film resulting from the process of the present invention.

Referring now to FIG. 3, since the material forming cover sheet 18 is miscible with, and preferably the same as, the second polymeric material of the second layer of sheet 10, the two materials blend together to form a single, homogenous layer 38. This thermoplastic layer 38 is still strongly bound to the first layer 40 of sheet 10. An important feature of the present invention is the manner in which the slivers 42 are suspended or embedded in the homogenous layer 38. By applying slivers 42 to a material which is miscible with the material of cover sheet 18, the slivers may be suspended in the resulting single layer without the creation of a discernable interface surrounding the sliver network. This minimizes wrinkles and voids in film 36, and increases the film's integrity. Avoidance of another interface also increases transmissivity.

The film 36 resulting from this process provides not only static-shielding, but also shielding against electromagnetic interference (EMI). In order to provide shielding against strong EMI signals, however, it is necessary to provide a more dense sliver network, although the amounts necessary are still much less than that required by prior art techniques. For example, as previously noted, Daimon et al. ('027) teaches that the network must have minimum density of 15 g/m$^2$ to provide EMI shielding. A film created in accordance with the present invention requires less than 15 g/m$^2$ of slivers to provide equivalent shielding, and preferably has a density of about 10 g/m$^2$. If EMI is not a concern, but protection is only required against static electrical fields, then a density of 2 g/m$^2$ or less of slivers has proven adequate.

Figure 4:
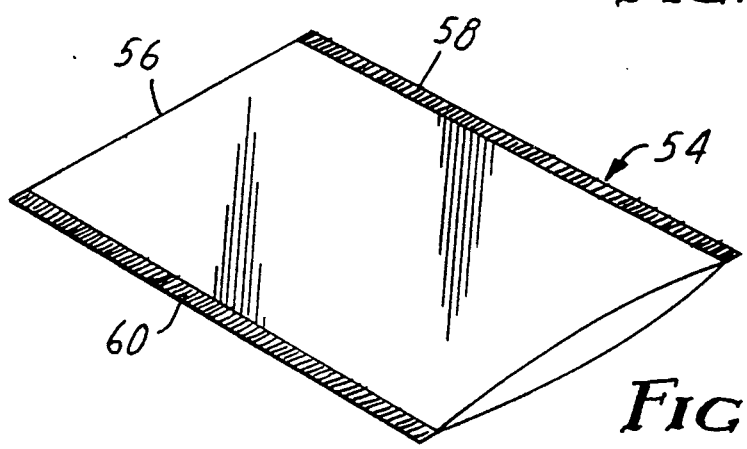
FIG. 4 is a perspective view of a pouch made from the static-shielding film in accordance with the present invention.

Film 36 can be further modified by adding antistatic/static-dissipative agents to the polymeric compounds forming sheets 10 and 18, or by coating (using conventional techniques) the outer surfaces of film 36 with such agents. Such agents are well known and include, e.g., quaternary ammonium compounds. The preferred antistatic compound is one sold by 3M under the brand name FC170C (an octoperfluoro polyether sulfonamide), and is volume-loaded into the film in an amount in the range of 0.1%–0.4% by weight. Whether the antistat is loaded or coated, transmissivity of film 36 is still at least 70%, and tests have shown that films made in accordance with the foregoing processes have transmissivity levels as high as 85%. Furthermore, film 36 can protect not only electronic components, but also any materials or instruments which may be sensitive to electric fields/discharge, including chemicals and pharmaceuticals. Film 36 may be formed into a variety of packages, such as the pouch 54 shown in FIG. 4. Pouch 54 is formed by longitudinally folding film 36, forming a side 56, and simultaneously heat sealing the film along two lines 58 and 60 transverse to the length of film 36 and cutting film 36 at sides 58 and 60. In this regard, one of the two polymeric materials used in sheet 10 should be heat-sealable (e.g., polyethylene). Those skilled in the art will appreciate the many other uses for film 36.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. For example, there are several alternative methods for applying the slivers from tow 14 to sheet 10 which are not discussed herein. Also, the first layer of sheet material 10 may comprise a carrier which is releasable from the polymeric material forming the second layer thereof. Finally, the resulting film 36 has other uses besides electrostatic shielding, such as a susceptor for microwave ovens. It is therefore contemplated that the appended claims will cover such modifications that fall within the true scope of the invention.

I claim:

1. A film for providing static shielding, comprising;
   a first layer of a carrier material which is electrically insulative, flexible, and transparent;
   a second layer of a homogenous polymeric material which is electrically insulative, flexible, transparent, and thermoplastic, said first layer being bonded to said second layer; and said second layer having a melting temperature which is lower than that of said carrier material; and
   a plurality of overlapping conductive slivers suspended in said second layer, forming an essentially two-dimensional, conductive network, said slivers having a melting temperature above the melting temperature of said polymeric material.

2. The film of claim 1 wherein either said first layer or said second layer includes an antistatic agent.

3. The film of claim 1 having a total thickness no greater than about 100 $\mu$m.

4. The film of claim 1 which passes at least 70% of visible light.

5. The film of claim 1 wherein said slivers have an average diameter of about 8 $\mu$m or less.

6. The film of claim 1 wherein said slivers are formed of a magnetic or paramagnetic material.

7. The film of claim 1 wherein said polymeric material is selected from the group consisting of low-density polyethylene, linear low-density polyethylene, high density polyethylene, ethylene methyl acrylate, ethylene vinyl acetate, or ethylene ethylacrylate.

8. The film of claim 1 wherein said slivers are present in an amount less than 15 g/m$^2$.

9. The film of claim 1 wherein said slivers are present in an amount not greater than about 2 g/m$^2$.

10. The film of claim 1 wherein said polymeric carrier material is biaxially oriented and dimensionally stable.

11. The film of claim 10 wherein said polymeric carrier material is selected from the group consisting of polyester, polypropylene or nylon.

12. A film for providing static shielding, comprising;
    a first layer of a first polymeric material which is electrically insulative, flexible, dimensionally stable and transparent;
    a second layer of a second homogenous polymeric material which is electrically insulative, flexible, transparent, and thermoplastic, and has a melting temperature which is lower than the melting temperature of said first polymeric material, said first layer being bonded to said second layer; and
    a plurality of conductive slivers suspended in said second layer, forming an essentially two-dimensional, conductive network, said slivers further being present in an amount not greater than about 2 g/m$^2$, and the film passing at least 70% of visible light.

13. The film of claim 12 wherein said slivers have a melting temperature above the melting temperature of said second polymeric material.

14. The film of claim 12 wherein said first polymeric material is selected from the group consisting of polyester, polypropylene or nylon.

15. The film of claim 12 wherein said second polymeric material is heat-sealable.

16. The film of claim 12 wherein said slivers are formed of stainless steel.

17. A package made with the film of claim 12 by folding the film to define a folded edge, heat sealing the film along two lines which are generally perpendicular to said folded edge, forming two heat-sealed edges, and cutting the film at said heat-sealed edges.

18. The film of claim 12 wherein said second polymeric material is selected from the group consisting of low-density polyethylene, linear low-density polyethylene, high density polyethylene, ethylene methyl acrylate, ethylene vinyl acetate, or ethylene ethylacrylate.

19. A flexible, transparent film providing protection against static electric fields, comprising;
    a first layer, having first and second surfaces, of a first polymeric material which is electrically insulative, flexible, dimensionally stable and transparent, said first polymeric material being selected from the group consisting of polyester, polypropylene or nylon;
    a second layer, having first and second surfaces, of a second polymeric material which is electrically insulative, flexible, transparent, and thermoplastic, and has a melting temperature which is lower than the melting temperature of said first polymeric material, said second polymeric material being selected from the group consisting of low-density polyethylene, linear low-density polyethylene, high density polyethylene, ethylene methyl acrylate, ethylene vinyl acetate, or ethylene ethylacrylate, and said second surface of said first layer being bonded to said first surface of said second layer;
    a plurality of stainless steel slivers suspended in said second layer, proximate said first surface thereof, forming an essentially two-dimensional, conductive network, said slivers having a melting temperature which is higher than the melting temperature of said second polymeric material and further being present in an amount not greater than about 2 g/m$^2$; and
    the film passing at least 70% of visible light.

* * * * *